United States Patent
Christensen, Sr.

(10) Patent No.: US 6,873,098 B2
(45) Date of Patent: Mar. 29, 2005

(54) ELECTROLUMINESCENT DEVICES AND DISPLAYS WITH INTEGRALLY FABRICATED ADDRESS AND LOGIC DEVICES FABRICATED BY PRINTING OR WEAVING

(75) Inventor: Alton O. Christensen, Sr., 15607 Vanty Falls, Houston, TX (US) 77068

(73) Assignee: Alton O. Christensen, Sr., Houston, TX (US)

( * ) Notice: Subject to any disclaimer, the term of this patent is extended or adjusted under 35 U.S.C. 154(b) by 557 days.

(21) Appl. No.: 09/823,269

(22) Filed: Mar. 30, 2001

(65) Prior Publication Data

US 2001/0045798 A1 Nov. 29, 2001

Related U.S. Application Data

(63) Continuation-in-part of application No. 09/218,233, filed on Dec. 22, 1998, now Pat. No. 6,229,259.

(51) Int. Cl.$^7$ .............................................. H05B 33/00
(52) U.S. Cl. ..................... 313/498; 313/506; 428/917; 257/99; 257/431
(58) Field of Search ................................. 313/498, 499, 313/506; 315/169.3; 428/917; 257/88, 89, 93, 99, 431, 432

(56) References Cited

U.S. PATENT DOCUMENTS 5,394,004 A 2/1995 Jeong ......................... 257/431
5,656,883 A * 8/1997 Christensen ................. 313/310
5,821,688 A * 10/1998 Shanks et al. ............... 313/498
6,229,259 B1 * 5/2001 Christensen, Sr. ........... 313/498
6,492,966 B1 * 12/2002 Christensen ................. 345/76

OTHER PUBLICATIONS

R.H. Friend, R.W. Gymer, A.B. Holmes, J.H. Burroughes, R.N. Marks, C. Taliani, D.D.C. Bradley, D.A. Dos Santos, J.L. Bredas, M. Logdlund 7 W.R. Salaneck, "Electroluminescence in conjugated polymers," Jan. 14, 1999, 1999 Macmillian Magazines Ltd., pp. 121–128.

* cited by examiner

*Primary Examiner*—Ashok Patel
(74) *Attorney, Agent, or Firm*—Moser, Patterson & Sheridan, L.L.P.

(57) ABSTRACT

Improved electroluminescent and photonic devices with integrated logic and control circuits are disclosed. Low mobility, contact barrier, space charge limitation and carrier balancing are provided solutions that increase efficiency, reliability and longevity of the devices. Device power loss and power requirements are reduced. True-ohmic contact materials allow a gate-controlled, light emitting organic triode MESFET configuration that eliminates commonly used ITO thereby increasing luminous output, and providing ease of address and control by integrally fabricated complementary MESFET address and control circuitry. The devices can be fabricated by printing or by weaving appropriate materials, and can be configured as color displays.

26 Claims, 4 Drawing Sheets

ELECTROLUMINESCENT DEVICES AND DISPLAYS WITH INTEGRALLY FABRICATED ADDRESS AND LOGIC DEVICES FABRICATED BY PRINTING OR WEAVING

CROSS-REFERENCE TO RELATED APPLICATIONS

This application is a continuation-in-part of U.S. patent application Ser. No. 09/218,233, filed Dec. 22, 1998 now U.S. Pat. No. 6,229,259. The aforementioned related patent application is herein incorporated by reference.

BACKGROUND OF THE INVENTION

1. Field of the Invention

This invention is directed toward triode electroluminescent devices, structures and materials comprising carrier injection contacts which are applied to improve or replace organic light emitting diode (LED) fabrication processes and contact materials. More particularly, the invention is directed toward solution deposited and ink-jet printed metal-organic and organic-polymer semiconductors and electroluminescent semiconductors which are used to form panel displays and other photonic devices and products. Alternately, the devices can be fabricated by weaving constituent materials.

2. Description of the Related Art

U.S. Pat. Nos. 5,656,883 and 4,663,559, both to Alton O. Christensen, Sr. (Christensen) disclose true-ohmic contact structures for injecting charge into a vacuum interface, namely, field emission. U.S. Pat. No. 5,977,718, U.S. patent application Ser. No. 08/281,912 now U.S. Pat. No. 6,492,966 and U.S. patent application Ser. No. 09/218,233, all to Christensen, disclose other materials of a true-ohmic contact interface to inorganic, organic and polymer devices. More specifically, U.S. patent application Ser. No. 09/218,233 discloses woven polymer semiconductors and electroluminescent fibers comprising pixel components and control circuitry. Furthermore, U.S. patent application Ser. No. 08/281,912 discloses true-ohmic contacts to inorganic and metal-organic materials.

The status of the prior art in electroluminescent (EL) polymer device design is well documented by the review article by R. H. Friend, et al., in "Electroluminescence in Conjugated Polymers," NATURE, Vol.397, Jan. 14, 1999, p121. This article, hereafter referred to as "Friend", is limited to conjugate polymer light emitting diode devices (LED's) having indium-tin oxide (ITO) as the hole-injecting contact. The reference is cited not only as background of the prior art, but also because specific needs for improvement in the prior art are discussed. These are summarized as follows by topic with applicable page, column and initial line number:

1. Low barrier contacts: (page 124, col. 2, line 17) Friend states that both hole-injecting and electron-injecting electrodes with relatively low barriers for charge injections are required so that high current densities and concomitant light emission are produced at low voltages.
2. Low mobility: (page 124, col. 2, line 12) Friend states that mobility is field (energy) dependent.
3. Space charge limitation: (page 124, col. 2, line 1) Friend states that current flow in LED's is not limited by injection, but bulk limited by build up of space charge from low carrier mobility.
4. Current balancing: (page 125, col. 1, line 5) Friend states that injection and transport of holes into the bulk of the polymer must be matched by injection and transport of electrons from the opposite electrode, and that the control of injection rates (by introducing hetrojunctions) has been shown to be effective for obtaining charge balance.
5. Reduced radiative emission: (page 126, col. 1, line 25) Friend states that in device structures of the type discussed here, the presence of a metallic cathode (ITO) provides a mirror thereby reducing the emission rates.
6. Interchain interaction reduces radiative emission: (page 125, col. 2, line 38 and page 126, col. 1, line 3) Friend states that interchain interactions produce lower energy excited states not strongly radiative.
7. Need economic integrated pixel control circuitry; (Page 127, col. 1) Friend discusses needs for economically efficient means for producing integrated pixel control circuitry.

Improvements in these areas will be set forth in subsequent sections of this disclosure.

SUMMARY OF THE INVENTION

This disclosure is directed toward improvements in efficiency and operation of solution deposited and ink-jet printed electroluminescent and photonic devices. These devices can also be fabricated by weaving. Prior art interface low mobility, contact barrier, space charge limitation and carrier balancing are incorporated. These properties tend to increase efficiency, increase reliability and longevity, reduce a power loss, and reduce power requirement of LED devices. Contact materials and a light emitting triode configuration are disclosed that eliminates ITO commonly used in prior art devices. This increases luminous output, and provides ease of address and control by the use of integrally fabricated triode address and control circuitry.

As mentioned above, U.S. Pat. Nos. 4,663,559, and 5,656,883 to Christensen disclose a true-ohmic, no-barrier, non-tunneling, injecting contact between the low work function metal $Cr_3Si$ and $SiO_2$ (silica) as a n-type semiconductor, co-deposited as a cermet. Contact equilibrium accumulates the silica conduction band with electrons. These electrons are less than 1 electron volt (eV), and typically 0.6 eV from vacuum level. In U.S. patent application Ser. No. 09/218,233, this same interface physics is extended to an injecting, non-tunneling ohmic contact obtained between the cermet and n-type polymer semiconductors and electroluminescent (EL) material. This type of contact, at equilibrium, injects electrons into the polymer semiconductor conduction band, prohibits tunneling, and permits only minimal hole conduction. The ohmic contact to EL semiconducting polymers allows a third, gate terminal to be effective in controlling avalanche in the semiconductor. The cermet contact to EL polymer blocks hole current flow, increases EL carrier recombination, and improves efficiency and luminous output over prior art tunneling EL devices. Furthermore, U.S. patent application Ser. No. 09/218,233 discloses woven polymer semiconductors and electroluminescent fibers comprising pixel components and control circuitry. The apparatus and methods can be used to produce a flexible, cloth-like flat screen display.

U.S. Pat. Nos. 5,656,883 and 5,663,559, U.S. patent application Ser. No. 08/281,912 and U.S. patent application Ser. No. 09/218,233 are hereby entered into this disclosure by reference. This disclosure sets forth apparatus and methods for improving triode electroluminescent devices, structures and materials comprising carrier injection contacts, which are now applied to improve or replace organic LED fabrication processes and contact materials.

The improved apparatus and methods are particularly applicable to solution deposited and ink-jet printed metal-organic and organic/polymer semiconductors and electroluminescent semiconductors that form devices, displays and other photonic devices and products. Elements are printed in pattern and in a sequence required to produce cooperative elements of the devices.

An alternate means of fabrication is the weaving process disclosed in U.S. patent application Ser. No. 09/218,233 and previously entered into this disclosure by reference. A class of such polymers, consisting of microfibers of micron and sub-micron dimension, is woven into silk-like fabrics. The ability of certain co-polymers to emit light has been known for less than two decades. Selected conjugate or ladder-type polymers may have dielectric, resistive, thermal conductivity, n or p type conductivity and EL properties.

The above references entered by reference teach the principles, materials and means for providing true solid/solid interface Mott-Gurney, no-barrier, true-ohmic contact to n-type semiconducting inorganic and metal-organic compounds, polymers and co-polymers of band gaps greater than 2 eV used in electronic circuitry, EL and other photonic devices. In summary, the teachings and effects are as follows:

1. When contact is made between an n-type semiconductor and a conductor whose work function $\Phi_m$ is less than half of $(E_g/2-\chi)$ where $E_g$ is the semiconductor band gap and $\chi$ is the electron affinity, then charge exchange occurs to obtain equilibrium;
2. in the charge exchange, interface traps are filled and the conduction band of the semiconductor is accumulated with electrons;
3. the greater the positive difference between $(E_g/2+\chi-\Phi_m)$ and work function $\Phi_m$ the greater charge exchange occurs to achieve equilibrium, filling some bulk traps as well; and
4. the net effect is to increase conductivity, electron mobility and reduce space charge.

These principles, materials, and methods are utilized in the present invention. Two high conductivity contacting metals, each capable of producing true ohmic contact to semiconductors and EL semiconductors of band gap greater than 1.5 eV, are employed in the apparatus of the present invention. These contact materials are $CuCa_2$ with a work function of about 1.6 eV, and $Al_2Li_3$ with a work function of about 1 eV. $CuCa_2$ prevents diffusion and electromigration of Cu, has a relatively high conductivity and adapts readily into the prior art LED processing environment requiring background pressure of $10^{-6}$ mbar of $O_2$ (see Friend, page 123, col. 2, line 34). When fabricated by printing or other deposition means, $Al_2Li_3$ requires a suitably positive pressure of argon (Ar) both during the solution formation and the deposition. Polymers and co-polymers of electroluminescent devices and both $CuCa_2$ and $Al_2Li_3$ require protective coating, or overall encapsulation, to prevent oxidation. Either $CuCa_2$ contacts or preferably $Al_2Li_3$ contacts improve LED operation. Both $CuCa_2$ and $Al2Li_3$ alloy with polymer and co-polymer semiconductors and electroluminescent devices at about 30° centigrade.

Disclosed are method and means of eliminating the barrier and reduced radiative emission of prior art ITO cathode by transforming the LED structure into a triode gate controlled metal semiconductor field effect transistor (MESFET)-like structure having a surrounding gate that controls carrier energy and carrier balance. The true-ohmic contacts disclosed inject carriers and fill interface and bulk traps. This increases carrier mobility by a factor approaching $10^4$ and space-charge distance by a significant factor, allowing more concentration of radiative chain emission and thus more radiated output. The pixel MESFET operates in a short-channel, normally "off", gate-controlled high-energy mode, up to and including avalanche, thereby increasing radiative output and decreasing power required. Basis information on MESFET operation is included in the literature. The MESFET field has polymer-chain field orientation, rather than LED cross-chain field, thereby further improving efficiency and radiative emission by lowering non-radiative interchain reaction. The MESFET's surrounding gate enhances carrier balancing. Carrier balancing may be "tuned" for a particular polymer or copolymer by the positioning of the gate relative to the cathode. The MESFET gate electrode provides reduced cross talk and ease of pixel addressing as compared to LED's.

Since the MESFET device comprises organic elements, it will sometimes be referred to as an "organic" MESFET or "OMESFET".

BRIEF DESCRIPTION OF THE DRAWINGS

So that the manner in which the above recited features, advantages and objects the present invention are obtained and can be understood in detail, more particular description of the invention, briefly summarized above, may be had by reference to the embodiments thereof which are illustrated in the appended drawings.

DETAIL DESCRIPTION OF THE PREFERRED EMBODIMENT

The invention discloses electroluminescent and photonic devices with improved efficiency and operation. The devices are designed for efficient and cost effective fabrication using solution deposition and ink-jet printing methodology. Alternately the devices can be woven from appropriate materials as disclosed in U.S. patent application Ser. No. 09/218,233.

Interface low mobility, contact barrier, space charge limitation and carrier balancing are incorporated in the improved devices. These properties tend to increase efficiency, increase reliability and longevity, reduce a power loss, and reduce power requirement of LED devices. The use of true-ohmic contact materials in a light emitting triode OMESFET configuration is disclosed. This contact material in the disclosed configuration eliminates ITO commonly used in prior art devices.

This increases luminous output, and provides ease of address and control by the use of integrally fabricated triode address and control circuitry.

The above cited references, which are entered into this disclosure by reference, teach the principles, materials and means for providing true solid/solid interface Mott-Gurney, no barrier, true-ohmic contact to n-type semiconducting inorganic and metal-organic compounds, polymers and copolymers of band gaps greater than 2 eV. These contacts are embodied in electronic circuitry, EL and other photonic devices. Again summarizing, the references teach that a contact made between an n-type semiconductor and a conductor whose work function is less than the semiconductor band gap, charge exchange occurs to obtain a state of equilibrium. In the charge exchange process, interface traps are filled and the conduction band of the semiconductor is accumulated with electrons. The greater the difference between the band gap and the work function, the greater the exchange to achieve equilibrium thereby filling some bulk traps as well. The net effect is to increase conductivity and electron mobility of the device. These basic principles are applied to the present disclosure.

Two high conductivity contacting metals, each capable of producing true ohmic contact to semiconductors and EL semiconductors of band gap greater than 2 eV, are employed in the present invention. These contact materials are $CuCa_2$ with a work function of about 1.6 eV, and $Al_2Li_3$ with a work function of about 1 eV. $CuCa_2$ adapts readily into the prior art LED processing environment requiring background pressure of $10^{-6}$ mbar of $O_2$. As mentioned previously, printing and other solution deposition processes of $Al_2Li_3$ requires a suitably positive pressure of argon (Ar) both during the solution formation and the deposition. Polymers and co-polymers of electroluminescent devices and both $CuCa_2$ and $Al_2Li_3$ require protective coating, or overall encapsulation, to prevent oxidation. Either $CuCa_2$ contacts, or preferably $Al_2Li_3$, contacts improve LED operation. $SiO_2$ pacifies $Al_2Li_3$.

Prior art LEDs are contact barrier controlled and operate by tunneling of carriers. In the present invention, barriers are eliminated and radiative emission is reduced relative to prior art ITO cathode devices by transforming a LED structure into a triode having structural characteristics of an OMESFET including a surrounding Schottky gate that controls carrier energy and balance. True-ohmic contacts are formed and inject carriers fill interface and bulk traps. This increases carrier mobility by a factor approaching $10^4$ and space-charge distance by a factor of 40 or more, thereby allowing more concentration of radiative chain emission and thus more radiated output.

The pixel OMESFET embodiment operates in a short-channel, normally "off", gate-controlled high-energy mode, up to and including avalanche, thereby increasing radiative output and decreasing power required. Details of MESFET operation is included in standard texts such as a publication by M. E. Sze, *Physics of Semiconductor Devices*, page 322. The OMESFET field has polymer-chain field orientation, rather than LED cross-chain field, thereby further improving efficiency and radiative emission by lowering non-radiative interchain reaction. The OMESFET's surrounding gate enhances carrier balancing.

An important feature of the invention is that carrier balancing may be "tuned" for a particular polymer or co-polymer by the positioning of the gate relative to the cathode. The OMESFET gate electrode provides reduced cross talk and ease of pixel addressing as compared to LED's. OMESFET pixel address and control circuitry are integrally fabricated with pixel arrays for efficiency and economy of fabricating display products.

DESCRIPTION OF THE DEVICES

Figure 1:
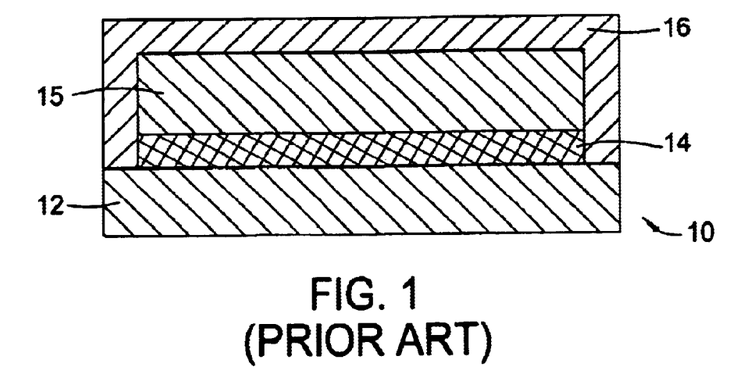
FIG. 1 is a partial cross section of a prior art electroluminescent diode.

Attention is first directed to FIG. 1 which is a partial section view of the prior art LED. The structure is generally denoted by the numeral 10. Starting at the bottom of the illustration, an organic EL material 14 contacts an ITO hole injection barrier contact 12. A low electron barrier contact is identified at 15 and may be Al, Ca, Mg or combinations thereof as reviewed by Friend. The resulting barrier is about 0.2 eV. Components 14 and 15 are encapsulated with a polymer encapsulating material 16. The prior art device is illustrated for background purposes only, and no claims are made regarding this illustration of the prior art.

Figure 2:
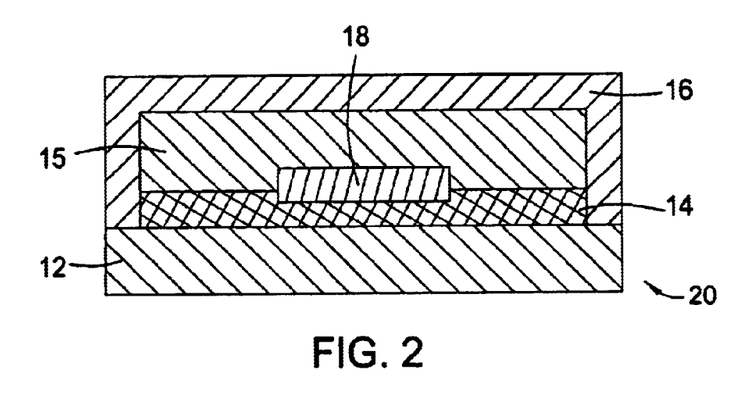
FIG. 2 is a partial cross section of an improve version of the prior art diode shown in FIG. 1.

FIG. 2 illustrates a partial section of an improved LED. The structure is generally denoted by the numeral 20. The device 20 is an improvement over the prior art device in function as well as in fabrication. Regarding fabrication, the device 20 as embodied can be solution deposited or "printed", as opposed to prior art deposition and etching methods. These techniques significantly reduce fabrication costs. As an example, an improvement is embodied by first printing or otherwise depositing organic electroluminescent material 14 upon a contact 12, followed by an overlay printing of a true-ohmic contact metal 18, and finally by an overlay printing of an interconnect metal 17. The true-ohmic contact metal 18 preferred is one having the largest ratio of the band gap of the EL material 14 to the work function of the contact metal. The preferred contact 18 is $Al_2Li_3$ of work function of about 1 eV. Solution forming and printing volatile $Al_2Li_3$ requires the same oxygen free environment as for layer 14, plus a suitable positive pressure of Ar. An alternative embodiment for contact 18 is to print $CuCa_2$ of work function of about 1.6 eV, which does not require an Ar environment. Both contact metals result in the previously discusses device operation and performance specifications. The same oxygen free environment required for printing of the EL material 14 is used to form solution and printing of $CuCa_2$. Components 14, 17 and 18 are encapsulated with a polymer material 16 on the contact 12, which is preferably a ITO hole injection contact 12.

Figure 3:
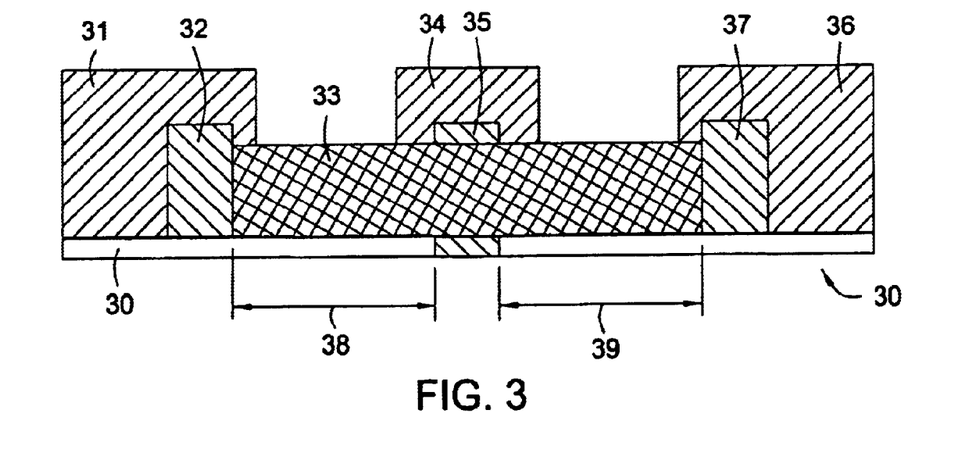
FIG. 3 is a cross section schematic of the preferred OMESFET used in pixels and control circuitry.

Attention is next directed to FIG. 3 which is a partial section of the improved EL device embodied as a OMESFET structure used in red, blue and green (R, B and G) pixels, and also used in pixel address and control circuitry. The OMESFET is an integral component of a video display, which is discussed in subsequent sections of this disclosure. The OMESFET structure is generally denoted by the numeral 30. The device 30 comprises a metal-organic or co-polymer n-type EL semiconductor 33. A source true-ohmic contact metal 32 contacts the source end of the EL semiconductor 33, and a drain true-ohmic contact metal 37 contacts the drain end of the EL semiconductor 33. A high work function surrounding gate metal 35 contacts the EL semiconductor 33 between the source contact metal 32 and the drain contact metal 37. The gate 35 is preferably fabricated from printed Au or other conductors and having a barrier to n-type semiconductor 33 of 5 eV or more. Interconnect metals for source 31, drain 37 and gate 35 are denoted by 31, 36 and 34, respectively. When the gate 35 is located equidistant from source 32 and drain 37, the distances designated 38 and 39 are equal and about 3000 nanometers (nm) each. Some co-polymer semiconductors may require gate 35 to be closer to source contact 32 for current balancing. In that instance, neither 38 nor 39 should exceed 3000 nm, to eliminate space-charge current limitation. Current balancing can thereby be "tuned" by placement of the gate 35.

Still referring to FIG. 3, the OMESFET device 30 is operated normally in the "off" mode. The source interconnect metal 31 is normally connected to system ground potential, as shown at 71 in FIG. 7. Gate interconnect metal 34 is operated at a negative potential relative to the source 31. That potential is supplied by address and control logic as discussed in subsequent sections of this disclosure. The drain interconnecting metal 36 is operated at a positive potential relative to that of source 31 and gate interconnect 34. That potential is also supplied by address and control logic device illustrated in FIG. 10.

Figure 4:
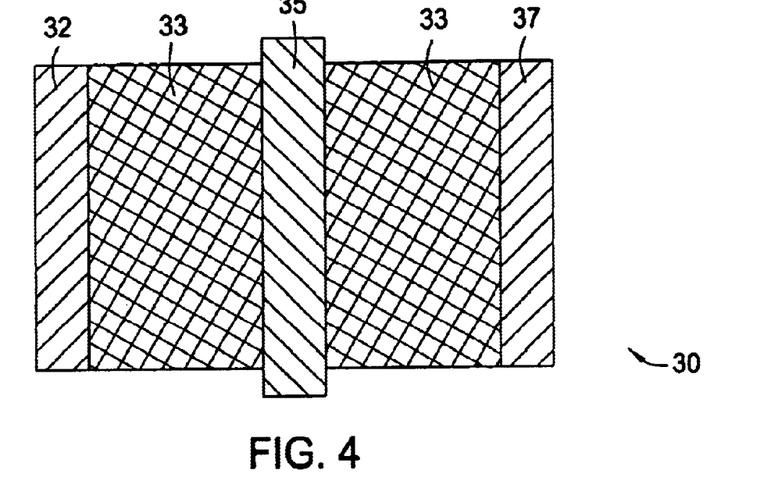
FIG. 4 is a partial planar view schematic of the preferred OMESFET used in pixels and control circuitry shown in FIG. 3.

Attention is next directed to FIG. 4, which is a partial planar view of the OMESFET shown in sectional view in FIG. 3. The structure is again denoted by the numeral 30. The organic semiconductor 33 is shown bounded on the left with the true-ohmic contact metal 32 of the source, and on the right by the true-ohmic contact metal 37 of the drain. The high barrier surround gate conductor 35 is shown positioned on the organic semiconductor 33 approximately midway between the true-ohmic contact metals 32 and 37. The interconnect metals 33, 34 and 36 have been omitted for clarity.

Figure 5:
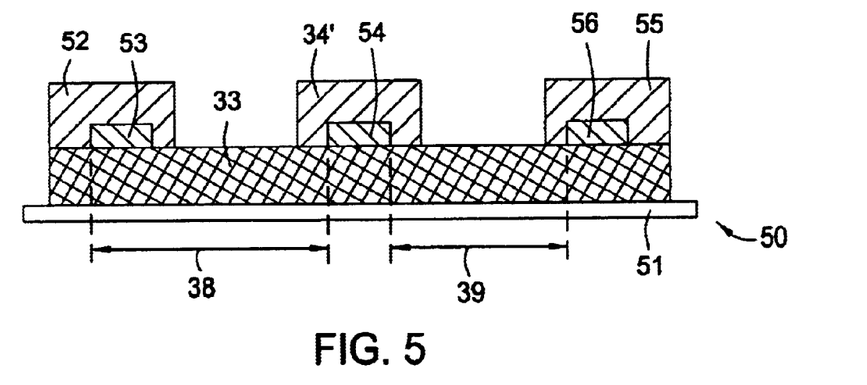
FIG. 5 is a partial cross section of an OMESFET suitable for fabrication using printing methods.

FIG. 5 shows a partial cross section of the EL device configured as an OMESFET and further configured for fabrication using solution deposition and printing techniques. This embodiment of the improved OMESFET is denoted as a whole by the numeral 50. Organic semiconductor material is deposited upon a substrate 51. True-ohmic contact metals 53 and 55 are next deposited upon the organic semiconductor material 33 as elements source and drain contacts, respectively. Preferably in the same fabrication step, a high barrier surface gate conductor 54 is deposited upon the organic semiconductor 33 at a distance 38 from the true-ohmic contact metal 53 and a distance 39 from the true-ohmic contact metal 56. Finally, source interconnect metal 52, drain interconnect metal 55, and gate interconnect metal 34 are deposited over the elements 53, 56 and 54, respectfully. The elements must be encapsulated to protect from oxygen. This encapsulation is not shown for reasons of clarity.

Figure 6:
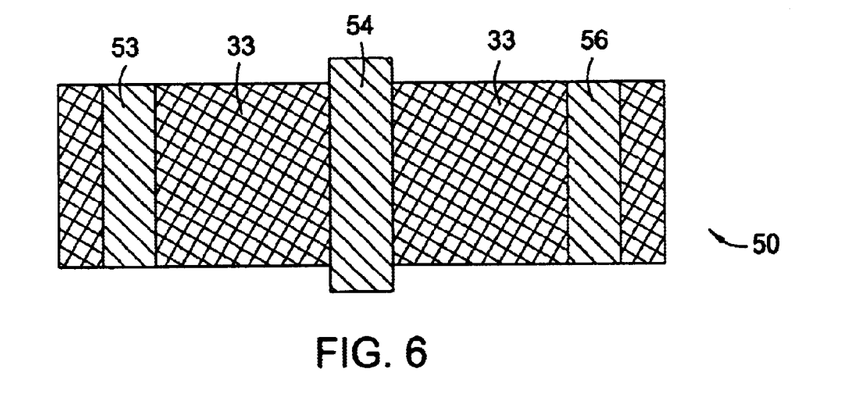
FIG. 6 is a partial planar view of the OMESFET illustrated in FIG. 5.

FIG. 6 is a partial planar view of the OMESFET shown in sectional view in FIG. 5. The structure is again denoted by the numeral 50. The organic semiconductor 33 is shown bounded on the left with the true-ohmic contact metal 53 of the source, and on the right by the true-ohmic contact metal 56 of the drain. The high barrier surround gate conductor 54 is shown positioned on the organic semiconductor 33 approximately midway between the true-ohmic contact metals 53 and 56. The interconnect metals 52, 34 and 55 have been omitted for clarity.

Figure 7:
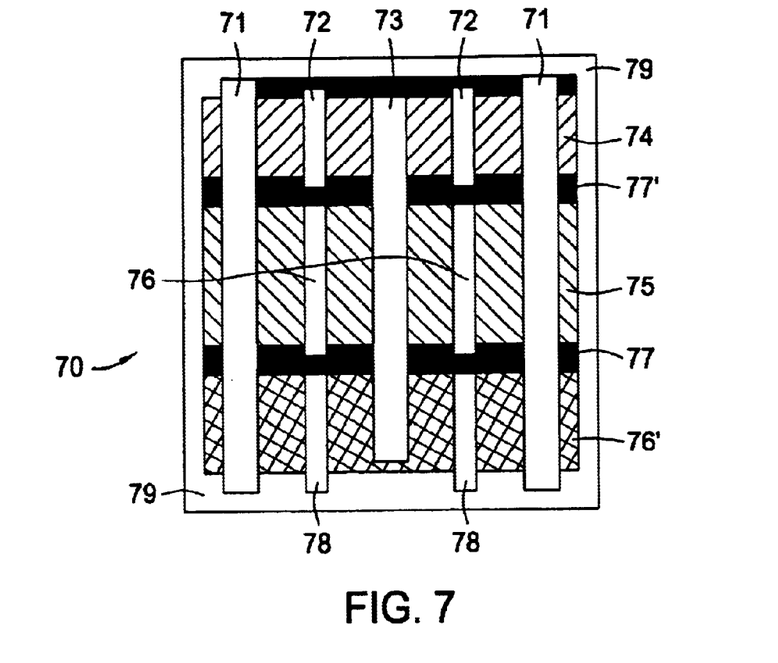
FIG. 7 is a planar topology of a pixel comprised of three pairs of red, green and blue (RGB) emitting OMESFET's.

FIG. 7 is a planar view of a three pairs of red, green and blue (RGB) emitting EL OMESFETs configured as a pixel. Green luminous EL co-polymer 74, blue luminous EL co-polymer 75, and red luminous EL co-polymer 76' are deposited upon a transparent substrate and oxygen barrier 79. Common source true-ohmic contact and interconnect metals are denoted by the numeral 71. Gate electrodes for redundant green pixel elements, blue pixel elements and red pixel elements are identified as 72, 76 and 78, respectfully. Elements 77 and 77' are inter EL co-polymer isolation dielectric elements. The pixel common drain and true-ohmic contact and interconnect is shown at 73.

Figure 8:
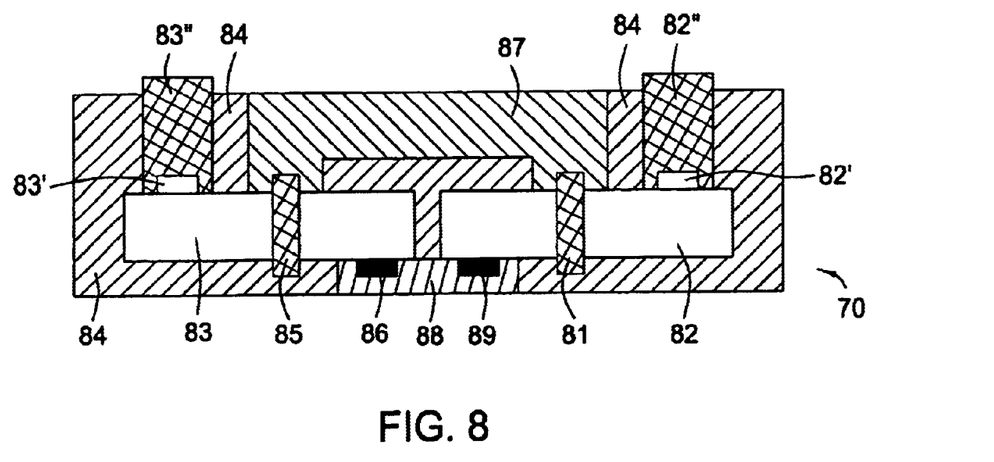
FIG. 8 is a cross section of the preferred complementary OMESFET logic device.

FIG. 8 is a cross section of a complementary OMESFET logic device 70. Such a device is suitable for controlling pixels in a video display as will be illustrated subsequently. A logic output interconnect metal is shown at 88 contacting high barrier surrounding gates 81 and 85. Isolating dielectric 84 abuts opposing sides of the logic output interconnect metal 88. Element 82 is an n-type semiconductor with a high barrier surrounding gate 81. Element 83 is a p-type semiconductor with a high barrier surrounding gate 84. A n-source ohmic contact metal 82' and cooperating n-drain interconnect metal 82" contact the n-type semiconductor 82. Likewise, a p-drain ohmic contact metal 83' and cooperating p-drain interconnect metal 83" contact the p-type semiconductor 83. A gate metal 87 contacts the high barrier surrounding gates 85 and 81, the p-type semiconductor element 83, and the n-type semiconductor element 82. The gate interconnect metal 87 is isolated from the p-drain interconnect metal 83" and the n-drain interconnect metal 82" by isolating dielectric material 84.

Fabrication by Printing

The devices of the present disclosure, and more specifically a color video display device, can be fabricated by printing elements of the device upon a transparent substrate in patterns and in a sequence required to fabricate the device.

Figure 9:
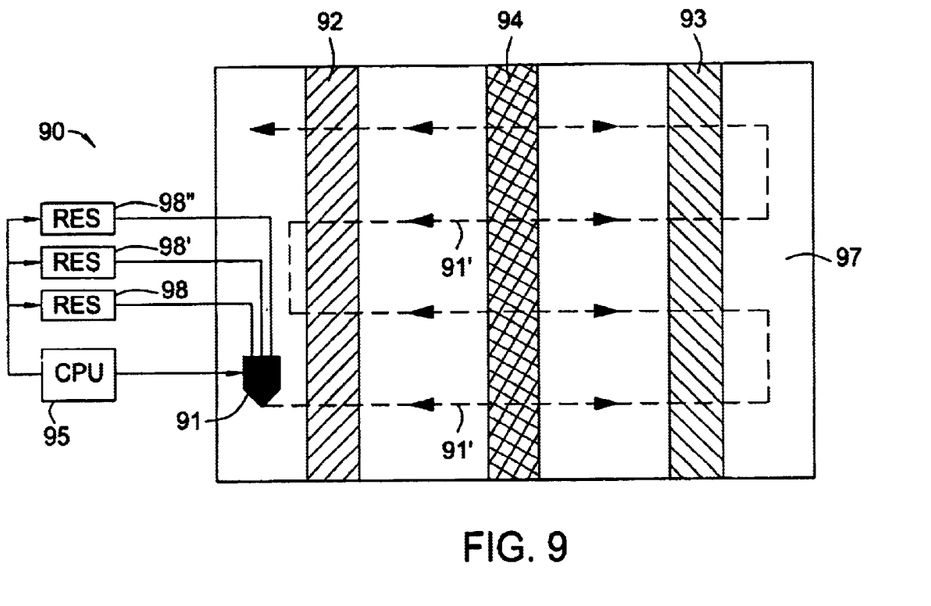
FIG. 9 is a conceptual, planar diagram of an ink-jet printing system filling polymer semiconductor areas in pattern and sequence to form an EL device.

FIG. 9 is a conceptual, planar diagram of an ink-jet printing system 90 filling polymer semiconductor areas in pattern and sequence to form an EL device. An ink jet 91 is supplied with appropriate materials for printing a device from a plurality of reservoirs 98, 98' and 98". It should be understood that additional or fewer reservoirs can be employed. Material is fed to the ink jet printer in quantity and type under the control of a central processor unit (CPU) 95, which is preprogrammed to fabricate a specific device. The ink jet 91 moves along a path 99 back and forth across an area 97 of semiconductor material depositing or "writing" appropriate components until the desired pattern and width is completed. Movement is controlled by the CPU 95 is preprogrammed to fabricate a specific type of device. Printing is carried out under a controlled atmosphere until the device is encapsulated for protection.

FIG. 9 illustrates, as an example, the ink-jet system 90 fabricating a particular portion of a specific device. The example device will have a potential between source 92 and drain 94, and a field therebetween controlled by gate 93. The object of ink-jet printing illustrated is to provide polymer chains parallel to the field applied to the device thereby increasing radiative emission, and reducing cross-chain carrier movement that seldom contributed to such emission.

It should be emphasized that fabrication of the devices discussed above by material deposition is not limited to ink jet printing. Other means of material deposition may be used such as stamping particular elements in particular patterns. Furthermore, combinations of material deposition may be effectively employed. As an example, a surface of organic semiconducting material can be fabricated by a number of means, and subsequent elements of the device can be deposited upon the semiconductor by ink-jet printing, or by stamping, or by other suitable methods.

Frabrication by Weaving

The devices of the present disclosure, and more specifically a color video display device, can alternately be fabricated by weaving or knitting particular inorganic and organic materials that are formed into fibers. This process is described in more detail in previously entered reference U.S. patent application Ser. No. 09/218,233. Polymer fibers, preferably in the form of thread, are used for EL, and dielectric isolation. Metals or cermets, preferably in the form of thread, are used for interconnection conductive polymer. Constituent fiber dimensions determine the size of the display device. Fiber width of all materials of the display can vary from sub-micron to millimeter dimensions. Size of the overall display is limited by the tensile strength of interwoven dielectric fibers. These fibers bear the stress of the looming of the display fabric, and are allowed to stretch as long as functional integrity is maintained. In weaving, "woof" refers to threads woven back and forth across fixed threads of the "warp" in a loom. In the context of the present disclosure, the length at which fiber strength fails and at which the fiber breaks determines the maximum dimension of warp and woof of the weaving loom. Pixel density of the display is proportional to the EL polymer fiber width, where the least display area has the highest pixel density. For a constant pixel density as display area increases, the thickness of the insulating fibers are increased to withstand the increased warp and woof tensions of the loom, thereby increasing the overall thickness of the display panel. The resulting fabric display has an overall area, or number of displays of a woven batch, limited only by the weaving loom's capability and the breaking point of the insulating fibers used. A full color flat-panel display can be as thin, front-to-back including encapsulation, of less than one-half inch. The display retains operational performance with mechanical flexing.

Integrated Logic Device

Figure 10:
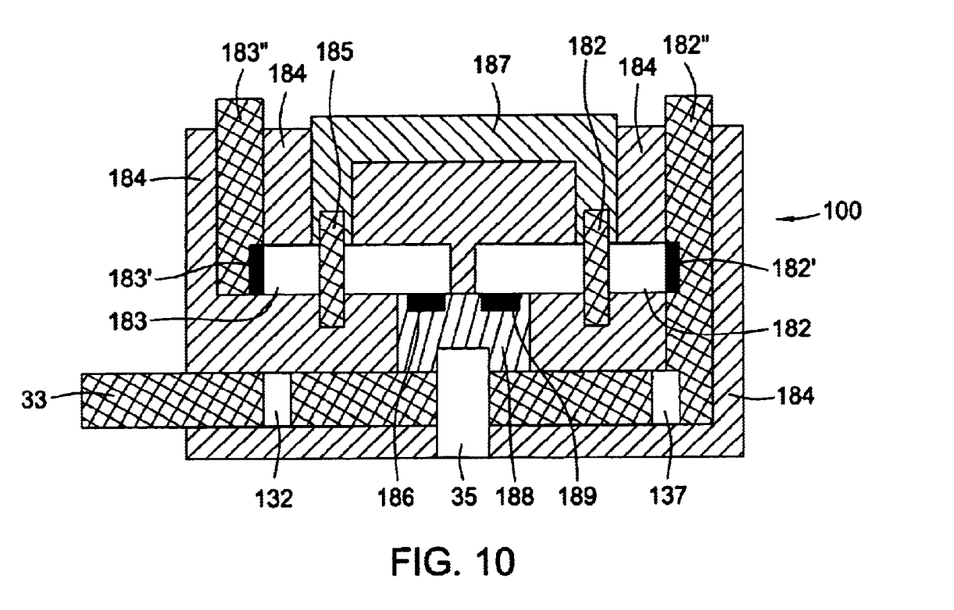
FIG. 10 is a partial cross section showing interconnected pixel elements shown in FIG. 3 and the OMESFET logic device shown in FIG. 8.

FIG. 10 is a partial cross section showing an integrated logic EL device 100 comprising the pixel element shown in FIG. 3 and the OMESFET logic device shown in FIG. 8. Material 184 is isolating dielectric material, which surrounds many elements of the device. Contacts 132, 135 and 137 are source, gate and drain contacts, respectfully, interfacing an organic semiconductor material 133. Logic output interconnect metal 188 contains p-source ohmic contact metal 186 and n-drain contact metal 189. The elements 183 and 182 are p-type semiconductor material and n-type semiconductor material, respectively. High barrier surround gates 185 and 181 contact the elements 183 and 182, respectfully. The elements 183' and 182' are p-drain ohmic contact metal and n-source ohmic contact metal, respectfully, and 183" and 182" are p-drain and n-drain interconnect metals, respectfully. Gate interconnect metal 187 connects the high barrier surrounding gates 185 and 181. The entire device is encapsulated with a suitable material (not shown) to exclude oxygen.

Several complementary OMESFETs are required to accomplish any given logic and control functions and can be integrally fabricated in layers above and connected to gate, source and drain terminals 34, 31 and 36, respectfully, shown in FIG. 3.

While the foregoing disclosure is directed to embodiments of the present invention, other and further embodiments of the invention may be devised without departing from the basic scope thereof is determined by the claims that follow.

What is claimed is:

1. An EL device comprising:
   (a) an EL material;
   (b) a interconnect metal contacting said EL material;
   (c) A true-ohmic injection contact contacting said EL material and said interconnect metal; and
   (d) a hole injection barrier contact which contacts said EL material.

2. The EL device of claim 1 wherein said EL device is fabricated by printing said EL material and said true-ohmic injection contact and said interconnect metal and said hole injection barrier contact in pattern and sequence required to produce cooperative elements of said EL device.

3. The EL device of claim 2 wherein:
   (a) said EL material is first printed upon said hole injection barrier contact;
   (b) said true-ohmic injection contact is next printed upon said EL material; and
   (c) said interconnect metal is next printed upon said EL material and said true ohmic injection contact.

4. The EL device of claim 1 further comprising polymer encapsulating material which encapsulates said EL material and said interconnect metal and said true-ohmic injection contact.

5. The EL device of claim 1 wherein said EL material and said interconnect metal and said true-ohmic injector contact are formed into fibers and said fibers organized in a warp and a woof of a weaving loom and are woven thereby forming a weave to fabricate said device.

6. The EL device of claim 5 wherein said weave is affixed to a transparent substrate.

7. The EL device of claim 1 wherein said true-ohmic contact metal comprises $Al_2Li_3$.

8. The EL device of claim 1 wherein said true-ohmic contact metal comprises $CuCa_2$.

9. The EL device of claim 1 wherein said EL material is organic.

10. A method for fabricating an EL device comprising the steps of:
   (a) providing an EL material;
   (b) contacting said EL material with an interconnect metal;
   (c) contacting said EL material and said interconnect metal with a true-ohmic injection contact; and
   (d) contacting said EL material with a hole injection barrier contact.

11. The method of claim 10 wherein said EL device is fabricated by printing in pattern and in sequence required to produce cooperative elements of said EL device.

12. The method of claim 11 comprising the additional steps of:
   (a) first depositing said EL material upon said hole injection barrier contact;
   (b) next printing said true-ohmic injection contact upon said EL material; and
   (c) next printing said interconnect metal upon said EL material and said true ohmic injection contact.

13. The method of claim 10 comprising the additional step encapsulating said EL material and said interconnect metal and said true-ohmic injection contact within an oxygen barrier polymer material.

14. The method of claim 11 comprising the additional step of printing with an ink jet printer.

15. The method of claim 11 comprising the additional step of printing within an oxygen free environment.

16. The method of claim 10 comprising the additional steps of:
(a) forming said EL material and said interconnect metal and said true-ohmic injector contact into fibers;
(b) organizing said fibers in a warp and a woof of a weaving loom; and
(c) weaving said fibers with said loom thereby forming said EL device.

17. A video display comprising an EL device and integrally fabricated address and logic devices for controlling said EL device, wherein said EL device comprises:
(a) an EL material;
(b) a interconnect metal contacting said EL material;
(c) A true-ohmic injection contact contacting said EL material and said interconnect metal; and
(d) a hole injection barrier contact which contacts said EL material.

18. The display of claim 17 wherein said EL device comprises at least one OMESFET comprising:
(a) a substrate;
(b) an organic semiconductor contacting said substrate;
(c) a first true ohmic contact metal contacting said semiconductor and at a first edge of said semiconductor;
(d) a second true ohmic contact metal contacting said semiconductor at a second edge of said semiconductor opposite said first edge;
(e) a high barrier surround gate contacting said semiconductor between said first true-ohmic contact metal and said second true-ohmic contact metal;
(f) a source interconnect metal contacting said first true-ohmic contact metal;
(g) a drain interconnect metal contacting said second true-ohmic contact metal; and
(h) a gate interconnect metal contacting said semiconductor and said high barrier surround gate.

19. The display of claim 18 wherein said EL device comprises three pairs of red, blue and green emitting OMESFETs.

20. The display of claim 17 further comprising:
(a) an optically transparent substrate; and wherein
(b) said display is fabricated by printing semiconductor elements of said display and insulating elements of said display and metal conducting elements of said display upon said substrate in pattern and sequence required to produce cooperative elements of said display.

21. The display of claim 17 wherein:
(a) semiconductor elements of said display are formed from semiconductor fibers, and insulating elements of said display are formed from insulating fibers, and metal conducting elements of said display are formed from conducting fibers;
(b) said semiconducting fibers and said conducting fibers and said insulating fibers are organized in a warp and a woof of a weaving loom; and
(c) said semiconducting fibers and said conducting fibers and said insulating fibers are woven in said loom to produce said video display.

22. A method for fabricating a video display comprising an EL device and integrally fabricated address and logic devices for controlling said EL device, the method comprising the steps of:
(a) providing an organic EL material;
(b) interconnecting a metal contacting said EL material;
(c) contacting said EL material and said interconnect metal with a true-ohmic injection contact; and
(d) contacting said EL material with a hole injection barrier.

23. The method of claim 22 wherein said EL device comprises at least one OMESFET comprising:
(a) a substrate;
(b) an organic semiconductor contacting said substrate;
(c) a first true ohmic contact metal contacting said semiconductor and at a first edge of said semiconductor;
(d) a second true ohmic contact metal contacting said semiconductor at a second edge of said semiconductor opposite said first edge;
(e) a high barrier surround gate contacting said semiconductor between said first true-ohmic contact metal and said second true-ohmic contact metal;
(f) a source interconnect metal contacting said first true-ohmic contact metal;
(g) a drain interconnect metal contacting said second true-ohmic contact metal; and
(h) a gate interconnect metal contacting said semiconductor and said high barrier surround gate.

24. The method of claim 23 wherein said EL device comprises three pairs of red, blue and green emitting OMESFETs.

25. The method of claim 22 further comprising the steps of:
(a) providing an optically transparent substrate;
(b) depositing said organic EL material upon said substrate; and wherein
(c) fabricating said display by printing insulating elements of said display and metal conducting elements of said display upon said substrate in pattern and sequence required to produce cooperative elements of said display.

26. The method of claim 22 comprising the additional steps of:
(a) forming semiconductor elements of said display from semiconductor fibers, and forming insulating elements of said display from insulating fibers, and forming metal conducting elements of said display from conducting fibers;
(b) organizing said semiconducting fibers and said conducting fibers and said insulating fibers in a warp and a woof of a weaving loom; and
(c) weaving said semiconducting fibers and said conducting fibers and said insulating fibers in said loom to produce said video display.

* * * * *